United States Patent
Bachmaier et al.

(10) Patent No.: US 7,638,923 B2
(45) Date of Patent: Dec. 29, 2009

(54) OPERATING METHOD FOR A HYDRAULIC INJECTION VALVE COMPRISING A PIEZOELECTRIC ACTUATOR AND A CONTROL UNIT

(75) Inventors: Georg Bachmaier, München (DE);
Bernhard Fischer, Töging A. Inn (DE);
Bernhard Gottlieb, München (DE);
Andreas Kappel, Brunnthal (DE); Tim Schwebel, München (DE)

(73) Assignee: Siemens Aktiengesellschaft, Munich (DE)

( * ) Notice: Subject to any disclaimer, the term of this patent is extended or adjusted under 35 U.S.C. 154(b) by 514 days.

(21) Appl. No.: 10/533,813

(22) PCT Filed: Sep. 3, 2003

(86) PCT No.: PCT/DE03/02931

§ 371 (c)(1),
(2), (4) Date: May 2, 2005

(87) PCT Pub. No.: WO2004/040112

PCT Pub. Date: May 13, 2004

(65) Prior Publication Data

US 2006/0012265 A1    Jan. 19, 2006

(30) Foreign Application Priority Data

Oct. 31, 2002 (DE) .................. 102 50 917

(51) Int. Cl.
*H01L 41/09* (2006.01)

(52) U.S. Cl. .................. 310/317; 310/324; 367/69; 367/70

(58) Field of Classification Search .................. 310/317, 310/324; 367/69, 70, 71, 72
See application file for complete search history.

(56) References Cited

U.S. PATENT DOCUMENTS 4,398,204 A * 8/1983 Dietrich et al. ............... 347/68
5,036,263 A * 7/1991 Yamada et al. .............. 318/116

(Continued)

FOREIGN PATENT DOCUMENTS

DE    39 35 937 A1    5/1990

(Continued)

*Primary Examiner*—Walter Benson
*Assistant Examiner*—Bryan P Gordon
(74) *Attorney, Agent, or Firm*—Laurence A. Greenberg; Werner H. Stemer; Ralph E. Locher

(57) ABSTRACT

The invention relates to a method and a control unit for operating a hydraulic injection valve, which comprises at least one piezoelectric actuator (2), a displaceable component (3) and a hydraulic element (9) such as bearing or a transmission system. The use of a drive voltage (U) modifies the length of an actuator (2), which makes it possible to control the stroke of the displaceable component (a valve needle 3). The inventive control unit (10) produces a polarizing voltage (UB) which pre-stresses the actuator (2) and whose polarization direction is opposite to the polarization direction of said actuator (2). Said invention makes it possible to obtain the greater modification of the length when the actuator (2) operates in the polarization direction than the drive voltage starts at 0 volts, as it was in practice before. Said invention makes it possible to reduce energy consumption.

11 Claims, 4 Drawing Sheets

U.S. PATENT DOCUMENTS

| | | | | |
|---|---|---|---|---|
| 5,986,360 A | * | 11/1999 | Gerken et al. | 307/125 |
| 5,988,799 A | * | 11/1999 | Abe et al. | 347/68 |
| 6,679,474 B2 | * | 1/2004 | Cotton et al. | 251/129.06 |
| 6,739,575 B2 | * | 5/2004 | Cotton et al. | 251/129.06 |
| 2002/0048124 A1 | * | 4/2002 | Kuwajima et al. | 360/294.4 |

FOREIGN PATENT DOCUMENTS

| | | |
|---|---|---|
| DE | 197 34 895 A1 | 2/1999 |
| EP | 1 079 158 A2 | 2/2001 |

* cited by examiner

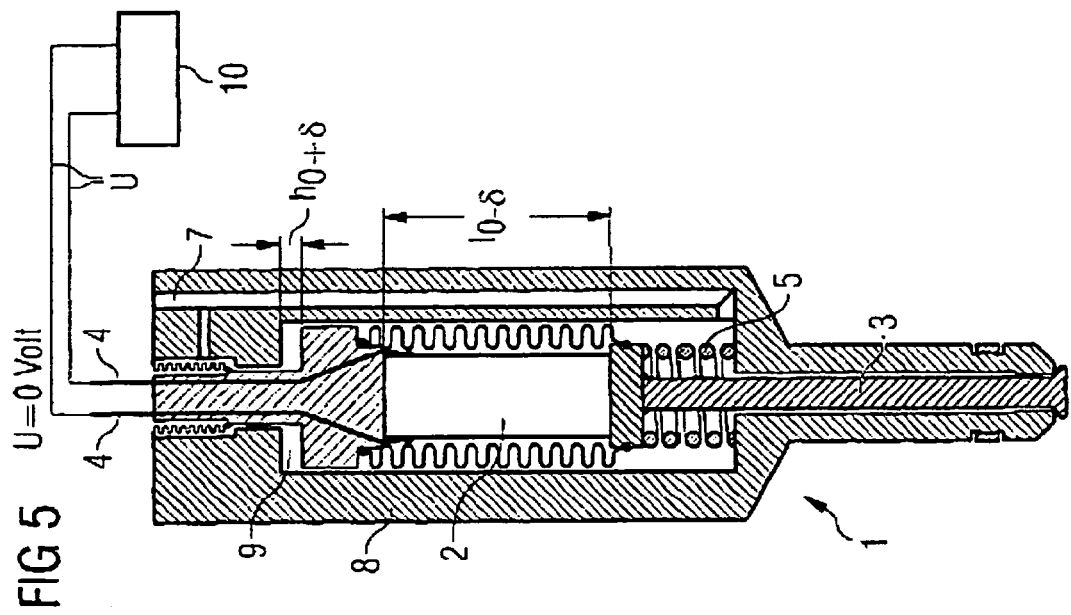
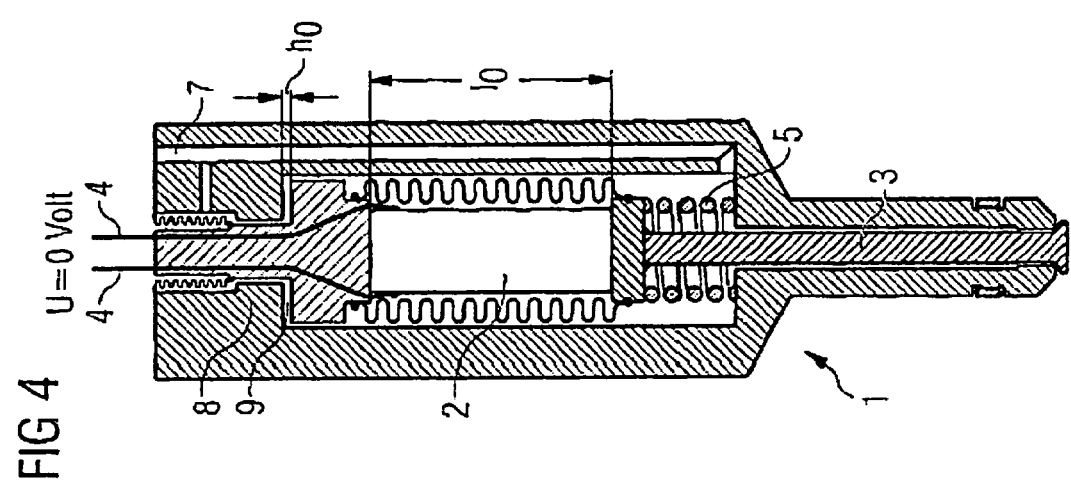

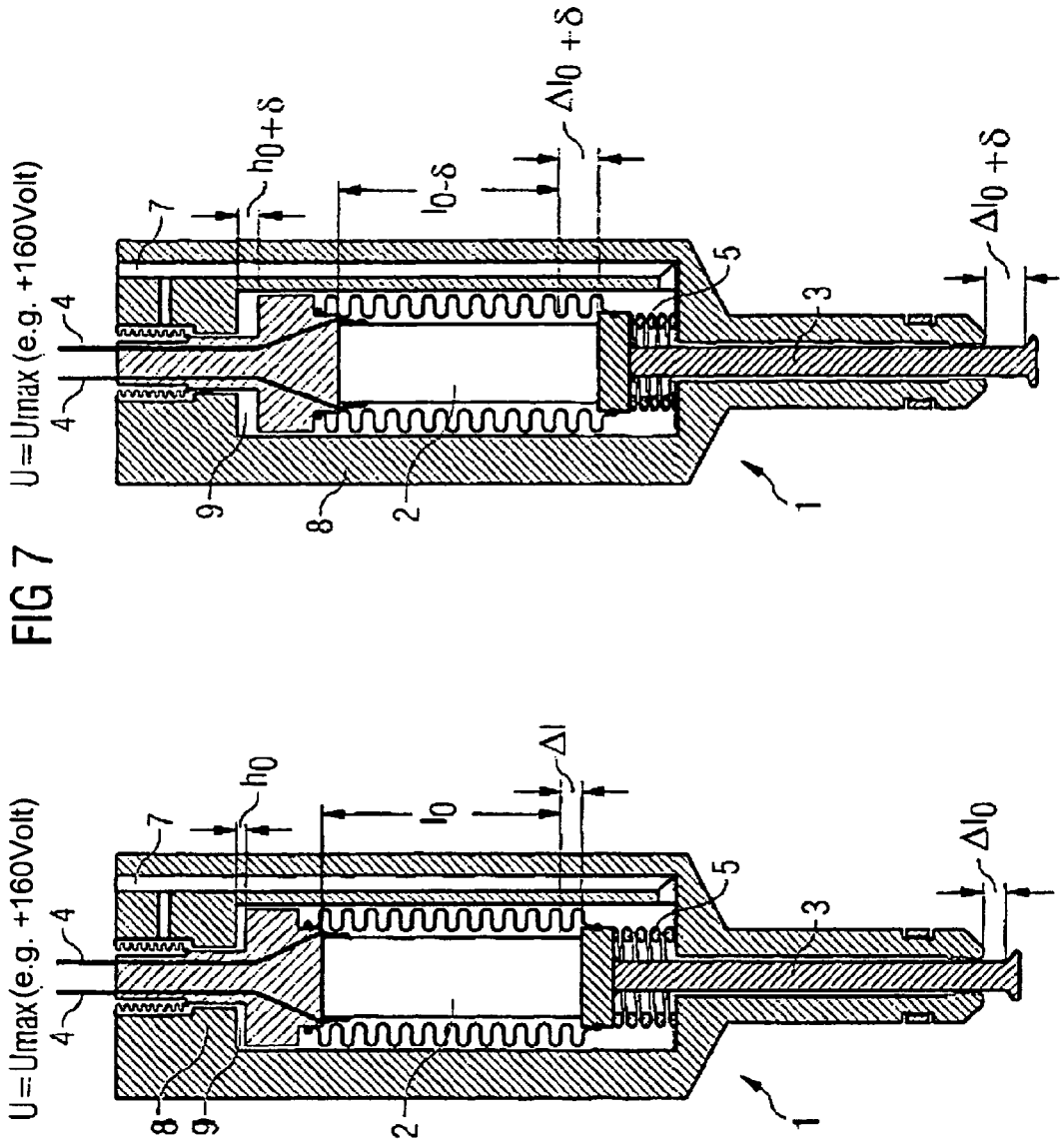

OPERATING METHOD FOR A HYDRAULIC INJECTION VALVE COMPRISING A PIEZOELECTRIC ACTUATOR AND A CONTROL UNIT

BACKGROUND OF THE INVENTION

Field of the Invention

The invention relates to a method for operating a hydraulic injection valve (injector) embodied having at least one piezoelectric actuator, a displaceable component and a hydraulic element, all of which are disposed in a common housing, wherein the stroke of said displaceable component can be reversibly controlled through the application of a drive voltage to the actuator, or relates, as the case may be, to a control unit of the kind cited in the independent claims 1 and 7. The use of a piezoelectric actuator operated by means of a drive voltage that corresponds to its polarization direction for controlling an injection valve, in particular for injecting fuel into an internal combustion engine, is already known. In order, for example, to directly actuate a valve needle of the injection valve, use is here made of the linear expansion which the actuator undergoes owing to the applied drive voltage. In the case of indirect use, the valve needle is by contrast opened through the impact of a shut-off valve (servo valve).

The linear expansion (elongation) is by dint of the underlying physical principle a very small quantity. To achieve a useful linear expansion, multilayer actuators such as PMAs (piezoelectric multilayer actuator), for example, have been developed and the applied drive voltage selected to be as high as possible, for example 160V. The linear expansion of an actuator of said type is nevertheless only 0.12% to 0.14% of the length of the actuator in the discharged condition. The stroke increases less than proportionally when higher voltages are applied. The field strengths in the individual layers of the piezoceramic, customarily 80 µm thick, by contrast then exceed 2 kV/m. This could then lead to new problems such as electric voltage punctures that would irreversibly damage the piezoceramic.

A large piezoceramic stroke, and hence valve needle stroke, is basically desirable particularly in the case of directly operated high-pressure injection valves since a large volume of injected material can also be achieved with a large stroke. This is a requirement in the case of, for instance, particularly powerful engines or racing engines.

A large valve needle stroke is desirable in the case of indirectly operated injection valves particularly because production tolerances can be increased with cost advantages being achieved thereby.

Attempts have also already been made to increase the actuator's overall length with the aim of increasing the valve needle stroke. Effective though this solution is, the piezoceramic is relatively expensive owing to the above-cited small elongation factor.

It is furthermore known how to control the volume of injected material by means of a voltage pulse that is as long as possible. The length of the injection pulse is, however, very constrained in the case of an internal combustion engine by the physical boundary conditions, in particular by the optimal injection instant, exhaust gas requirements, temperature, engine-running culture etc. Only a very short injection pulse can be selected especially in the case of multiple injection where up to five injections take place in a single cycle at very short intervals.

With known injection valves a hydraulic element (hydraulic bearing) is frequently also used as the play-compensating element for the purpose of avoiding parasitic gaps. The available actuator stroke can thereby be transmitted virtually to its full extent to the valve needle.

SUMMARY OF THE INVENTION

By contrast, the method according to the invention for operating a hydraulic injection valve or, as the case may be, the control unit having the characterizing features of the independent claims 1 and 7 offers the advantage that the elongation of the actuator and hence the stroke of the displaceable component can be increased without the need to increase the effective electric field strength. Damage to the actuator is effectively precluded by the applied bias voltage. It is seen as particularly advantageous here that no physical design changes are needed on the injection valve itself so that the method according to the invention can be applied generally to commercially available injection valves. A larger volume of injected material is moreover also advantageously achieved on account of the increased stroke of the displaceable component.

Advantageous developments of and improvements to the method cited in the independent claims 1 and 7 or, as the case may be, of and to the control circuit are provided by the measures cited in the dependent claims. It is seen as particularly advantageous here that the bias voltage is lower than a voltage that would result in changing the polarity of the actuator. This is because the actuator becomes shorter in this voltage range through the application of the bias voltage so that this shortening can be used as an additional elongation of the actuator when the drive voltage is applied.

Since owing to the hydraulic element in the injection valve the additional elongation of the actuator is transmitted virtually fully to the displaceable component, its stroke is advantageously larger without the need to make mechanical changes to the injection valve.

A further advantage is seen in the possibility also of achieving a reduction in energy consumption through the bias voltage. By displacing the drive voltage into the partially negative range energy consumption is reduced since, viewed in physical terms, this rises proportionally to the square of the voltage.

A favorable solution is also seen in using the drive voltage employing the bias voltage for the purpose of setting a defined stroke of the displaceable component. A volume of fuel requiring to be injected into an internal combustion engine, for example, can be advantageously controlled in a simple manner by the defined stroke without the need to vary the length of the injection pulses. The volume of injected material can thus be controlled in a very simple manner by way of the amplitude of the drive voltage and/or bias voltage.

An injection valve by means of which fuel such as gasoline or diesel is to be injected into an internal combustion engine under high pressure can be controlled particularly advantageously by means of the control unit. Owing to the low capacitances of the PMA piezoceramic, a very large number of switching times can be achieved with the actuator that are shorter than in the case of, for example, a solenoid valve, so that very large volumes are also possible in the case of multiple injections with precise fuel dosing.

The object of the invention is to disclose a method for operating a hydraulic injection valve having a piezoelectric actuator or, as the case may be, to disclose a control unit that can manage large rates of flow. Said object is achieved by means of the features of the independent claims 1 and 7.

An exemplary embodiment of the invention is shown in the drawing and is explained in more detail in the description that follows.

BRIEF DESCRIPTION OF THE DRAWING

FIG. 4 is a schematic of an injection valve where a bias voltage is not used and the displaceable component (valve needle) is closed, FIG. 5 shows the case presented in FIG. 3 using a bias voltage, FIG. 6 is a schematic of an injection valve where a bias voltage is not used but where the valve needle is open, and FIG. 7 shows the injection valve according to the invention having an open valve needle and using a bias voltage according to the invention.

DESCRIPTION OF THE PERFERRED EMBODIMENTS

To better understand the invention it will first be explained with the aid of the charts in FIG. 1 how owing to the physical conditions the length $\Delta l_0$ of an actuator changes as a function of an applied drive voltage U. The length of a PMA actuator depends not only on its outer electric field in keeping with the applied voltage but also on its previous electric history and its polarization state. In conjunction with the applied outer electric field, these two factors determine the current length of the PMA actuator. The invention now shows how the useful stroke of the actuator can be increased through skillful use of these relationships.

A voltage whose polarity is opposed to the actuator's preferred polarization is understood to be a negative voltage. A positive voltage correspondingly acts in the actuator's preferred direction.

Figure 1:
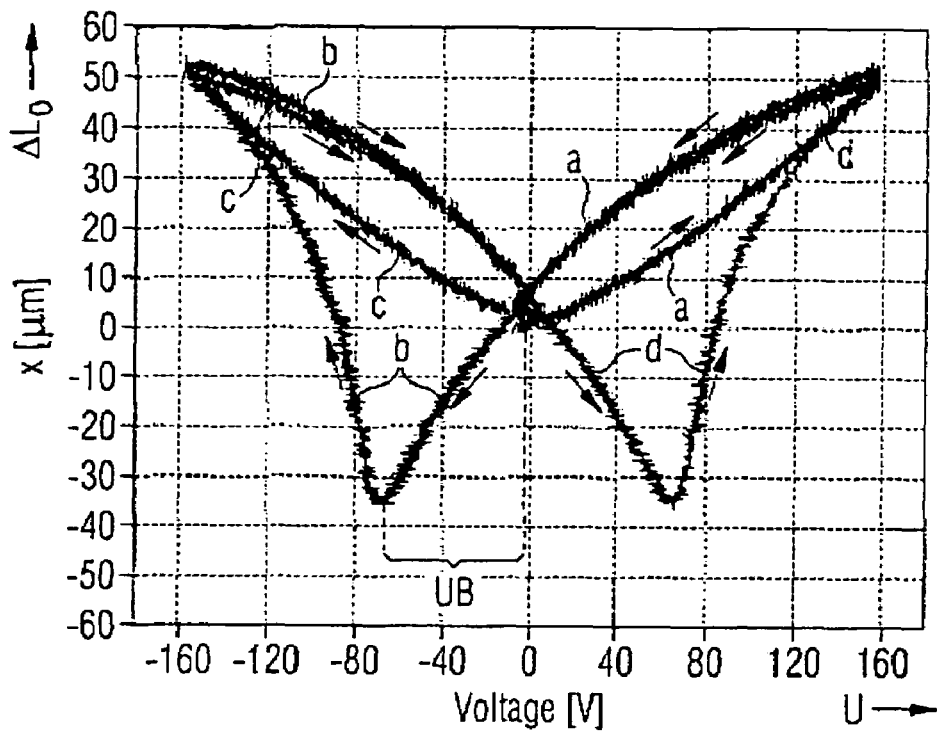
FIG. 1 is a chart in which the elongation of a piezoelectric actuator is shown schematically as a function of the applied drive voltage.

The chart in FIG. 1 shows a total of four curves a to d which effect a corresponding linear expansion or stroke when a voltage is applied to an actuator that is, say, 30 mm long. Curve a shows the known standard case where the drive voltage is initially driven from a value of 0V to 160V as indicated by the direction of the arrow. The stroke is here typically 0 . . . 50 µm. If the voltage is returned from 160V to 0V, the result will be the typical top hysteresis loop. The actuator returns in the process to its original length, accordingly 0 µm at 0V.

However, the stroke does not return immediately to 0 µm at the end of the voltage cycle. It is not the intention to deal in greater detail here with this effect known as slow 'creeping'. Curve a therefore displays an amassing of measuring points in the area of the zero point.

If a voltage 0V . . . −160V is then applied to the actuator in a second step according to the triangular curve b, the result in keeping with the lower branch of curve b will be a negative stroke of up to approximately −35 µm, which is to say a contraction of the actuator. The shortening of the actuator continues up to approximately −70V. The individual domains of the PMA actuator begin to reverse their polarity as the drive voltage U further increases negatively so that the length of the actuator will increase up to a value of −160V and a positive stroke of approximately 50 µm will be restored (left-hand rising branch of curve b). If the drive voltage is then returned from −160V to 0V, the stroke will also return to 0 µm.

Another completion of the voltage cycle from 0V to −160V and back to 0V will produce curve c, whose course mirrors that of curve a.

In a fourth step the drive voltage U was driven from 0V to +160V according to curve d, the result of which was again initially a further shortening of the actuator by approximately 35 µm at approximately 70V (curve d, lower branch). Polarity reversal again occurred at higher voltages so that the actuator expanded again. Returning the voltage U to 0V restored the original actuator length.

The invention makes use of the range within which the actuator is shortened by the application of a bias voltage UB. The bias voltage UB is here lower than the voltage that results in polarity reversal and hence in elongation. In our example it is possible to use the bias voltage UB between 0 and down to almost −70V, and correspondingly between 0 and up to almost +70V with reversed polarity. A stroke of up to 85 µm is thus achieved according to the invention, while the stroke would only be 50 µm without a bias voltage UB. Provision is further made for controlling the elongation of the actuator and hence a predefined stroke of the displaceable component by way of the level of the bias voltage UB and/or of the drive voltage U. Said targeted controlling of the volume of fuel to be injected into an internal combustion engine is especially advantageous.

The example given is naturally dependent on the selected piezoceramic and area of application used, which may also be temperature-dependent. However, a distinct increase in stroke is in principle always possible as the result of applying the bias voltage UB.

Figure 2:
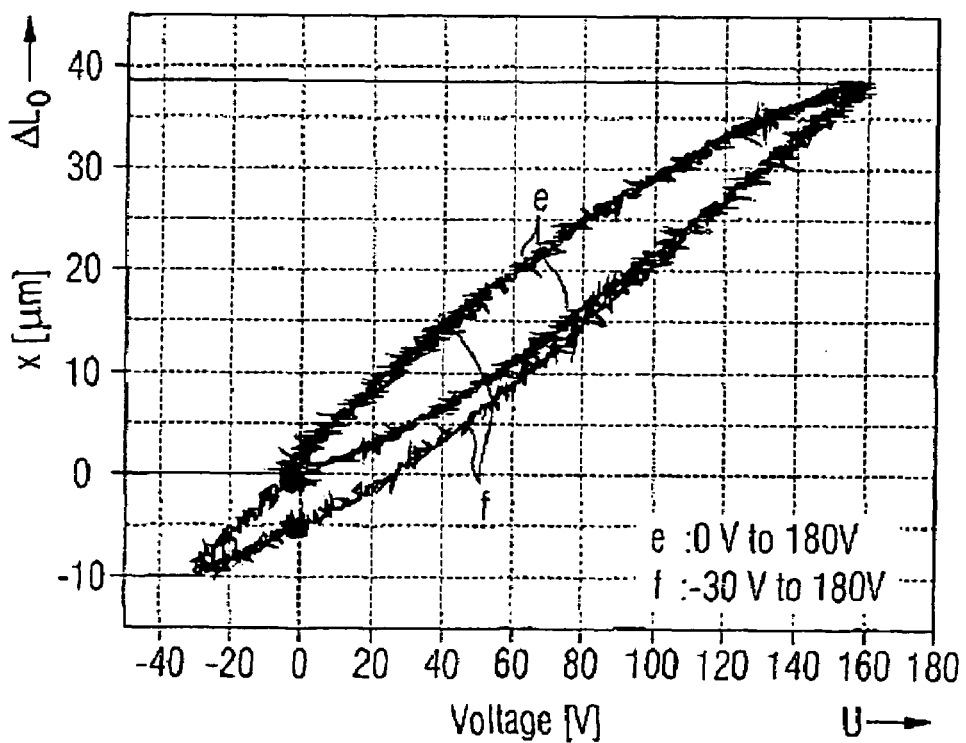
FIG. 2 shows two charts wherein one curve shows the elongation of the actuator without the use of a bias voltage and a second curve shows the elongation with the use of a bias voltage.

The two hysteresis curves in the chart in FIG. 2 show how a PMA actuator can be operated with a negative bias (bias voltage). Curve e first shows a known drive cycle as previously described in connection with curve a in FIG. 1. The drive voltage U is again pulsed between 0 and 160V. The stroke is approximately 38 µm at most. The hysteresis curve f shows how the stroke can be increased to approximately 48 µm by applying a bias voltage UB=−30V. The useful stroke could thus be increased by 10 µm, equating to 26%.

It is also of interest here to consider the actuator's energy requirements. The energy consumption is generally $E=U^2*C/2$, where C is the actuator's capacitance requiring to be charged. If, for example, the operating voltage is lowered by just 20V, which is to say from U=0 . . . 160V to U=−20 . . . 140V, with the same stroke, then the two energies will behave in the manner $(20^2+140^2)/160^2=0.78$. The energy requirement in the displaced range is thus approximately 22% lower than when no bias voltage is applied.

Figure 3A:
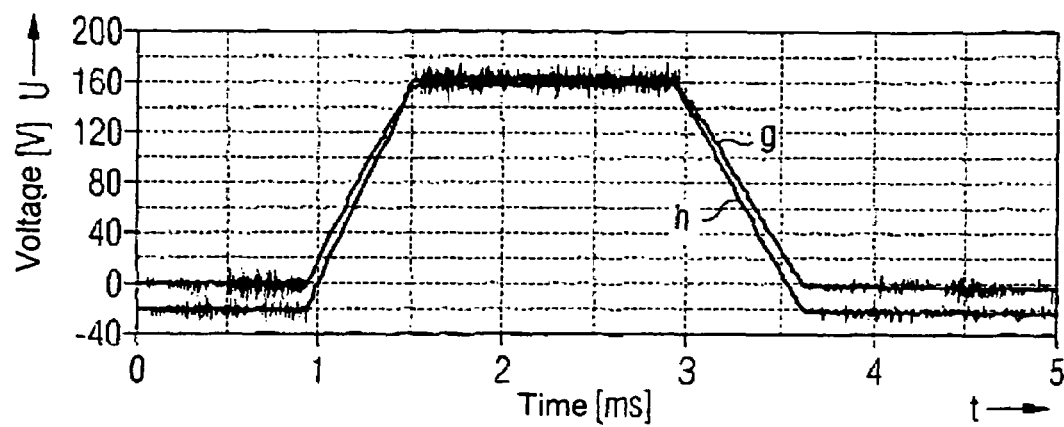
FIG. 3a shows two charts in which the voltage curve for a control pulse is plotted over time.
Figure 3B:
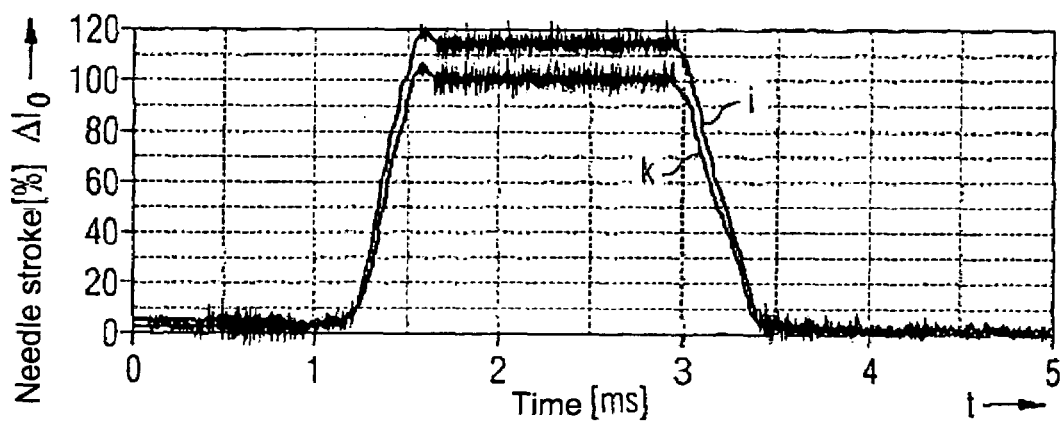
FIG. 3b shows two charts in which the valve needle stroke is plotted over time.

FIGS. 3a and 3b show charts of the type that can be used for, for example, PMA actuators (injectors) which are suitable for direct gasoline injection. The top curve g in FIG. 3a shows a drive voltage U in the range 0 . . . 160V as is known from the prior art. The lower curve h shows a drive curve according to the invention having a bias voltage UB=−20V, so that the drive voltage U passes through a cycle of between −20V and +160V.

The corresponding stroke curves for the displaceable component were shown in FIG. 3b. The lower curve k corresponds to the drive voltage according to curve g in FIG. 3a. The top curve i shows an increased stroke of the type expected according to the invention in keeping with curve h in FIG. 3a. In this exemplary embodiment the stroke has therefore been increased by approximately 15%, with only a minimal load increase for the actuator since the lower voltage level was set to −20V. A twofold advantage can therefore be achieved by means of the invention: The stroke is increased although the load for the actuator remains virtually constant.

To further illustrate the invention, the effects of the bias voltage UB on an injection valve 1 (injector), as used for, for example, injecting fuel into an internal combustion engine, are explained with the aid of FIGS. 4 to 7. For reasons of clarity, only a simple hydraulic high-pressure valve that can be used for, for instance, injecting gasoline has been shown for the injection valves illustrated here. The illustrations are not true to scale; they are in part shown enlarged since the changes in the actuator's length are in practice only in the µm range.

FIG. 4 first shows the injection valve 1 known per se having an actuator 2, a hydraulic element 9 and a displaceable component 3, all of which are disposed in a common housing 8. The displaceable component 3 is in this case embodied as a valve needle which opens downward with the elongation of the actuator 3. In the rest condition, which is to say without the application of a drive voltage U, the valve head is pressed against a discharge aperture by a resetting spring 5 so that said aperture is closed. The actuator 2 is furthermore permanently connected to the shaft of the valve needle 3. The top end of said actuator is in contact with a hydraulic element 9 which can be filled via a leakage gap from a high-pressure fuel line 7. The hydraulic element 9 here acts as a hydraulic bearing having a very long time constant compared to the discharge time of the actuator 2, which can be 1 to 5 ms. The displaceable parts are appropriately sealed against the housing 8 by means of a bellows. The actuator 2 is supplied with power via leads 4. The pulsed drive voltage U is switched during the powering process from 0V to a required value, for example +160V, and is switched back to 0V on completion of a pre-specified pulse duration (see FIG. 3a).

In the known injection valve 1 the hydraulic bearing 9 has a fluid level $h_0$ which can slowly change via the leakage gap. The actuator 2 is of length $l_0$ in the rest condition. The valve needle 3 opens according to curve k when the drive voltage U=160V is applied (see FIG. 3b).

Alternative provision is however also made for opening the valve needle 3 inward through redesigning the injector 1. In particular for diesel injection, where even greater pressures are generated, the injector 3 can also be embodied having a servo valve, with said valve acting upon a hydraulic element then embodied as a hydraulic transmission system.

The various types of injection valves are known per se, so their functioning does not have to be explained further.

The mode of operation of the invention when used with an injection valve 1 according to FIG. 4 will now be explained with reference to FIG. 5. The designations are again the same as those used in FIG. 4. A bias voltage UB-having a polarity opposing the polarization direction of the actuator 2 is now, however, applied to the actuator 2 with the aid of a control unit 10. Let it be assumed in this example that the preferred polarization in the piezoceramic is positively oriented so that the bias voltage UB is <0V, for example −30V. As a result of this, the actuator 2 reduces its length to $l_0$-δ. The hydraulic bearing 9 slowly fills up by the difference in length 5 until the hydraulic bearing 9 assumes the height $h_0$+δ. The actuator 2 remains in this state until the control unit 10 generates a positive drive voltage U that effects a corresponding elongation of actuator 2.

The two FIGS. 6 and 7 compare the functioning in the case of the known drive (FIG. 6) and in the case of the drive according to the invention (FIG. 7).

According to FIG. 6 the length $l_0$ of the actuator 2 now changes by the stroke $\Delta l_0$ when the drive voltage U=160V is applied. The stroke $\Delta l_0$ is in reality only approximately 0.13% of the length $l_0$ and is here shown greatly enlarged. The hydraulic bearing 9 substantially retains its height $h_0$. The small losses due to gap leakage are virtually negligible owing to the short operating time of typically 1 . . . 5 ms. The valve is likewise opened by the stroke $\Delta l_0$ owing to its permanent connection to the valve needle 3.

FIG. 7 shows the method according to the invention where a bias voltage UB that has shortened the actuator 2 has been applied to the injection valve 1. This case was explained previously in connection with FIG. 5. If, proceeding from the negative bias voltage UB, the drive voltage U=160V is likewise then applied by the control unit 10, the length of the actuator 2 will change to the value $\Delta l_0$+δ. The stroke of the valve needle 3 will hence also increase to the value $\Delta l_0$+δ and, compared to the known method, will exhibit a significant increase. The change in height δ of the hydraulic bearing 9 will be transmitted almost completely to the needle stroke if second-order effects such as the slightly altered rigidity of the hydraulic bearing resulting from the change in height are ignored. The needle stroke $\Delta l_0$+δ according to the invention will in any event always be greater than in the case of the prior art.

FIG. 7 shows an idealized snapshot of the condition immediately after the injector 2 has opened. The hydraulic bearing 9 empties over time and slowly drifts back. Specifying of the time constants should therefore be matched as precisely as possible to the real conditions. However, this harmonizing is of no fundamental significance for the method according to the invention.

We claim:

1. A method for operating an injection valve having housing and at least the following components commonly disposed in the housing:
   a piezoelectric actuator for generating a stroke, a displaceable component to be displaced, and a hydraulic element forming a hydraulic bearing for play compensation between the housing and the piezoelectric actuator,
   the method which comprises:
   biasing the actuator with a bias voltage having a polarity opposing a preferred polarity of the actuator, to thereby cause a preliminary contraction of the actuator and a corresponding increase in a height of the hydraulic bearing; and
   applying a drive voltage to the actuator, the drive voltage having a polarity corresponding to the preferred polarity of the actuator, to thereby generate a stroke of the displaceable component greater than the preliminary contraction of the actuator and having a value defined by a voltage-driven expansion of the actuator and the increase in the height of the hydraulic bearing.

2. The method according to claim 1, wherein the bias voltage is lower than a voltage causing a change in a polarity of the actuator.

3. The method according to claim 1, which comprises determining the bias voltage to effect a reduction in an energy consumption of the actuator.

4. The method according to claim 1, which comprises specifying the drive voltage together with bias voltage for setting a defined stroke of the displaceable component.

5. The method according to claim 4, which comprises determining a volume of material injected with the injection valve by way of the defined stroke of the displaceable component.

6. In a control unit for generating a drive voltage for an injection valve, the injection valve having at least one piezoelectric actuator, a displaceable component, and a hydraulic element forming a hydraulic bearing commonly disposed in a common housing;

said control unit being configured to generate a bias voltage for biasing the actuator in opposition to a preferred polarization direction of the actuator to cause a preliminary contraction of the actuator and a corresponding increase in a height of the hydraulic bearing, and to generate the drive voltage having a polarity in the preferred polarization direction of the actuator, to thereby generate a stroke of the displaceable component;

wherein the preliminary contraction of the actuator in combination with the following stroke represents an increase of the stroke of the displaceable component using the bias voltage and the increase in the height of the hydraulic bearing further increases the stroke of the displaceable component.

7. The control unit according to claim 6, wherein the bias voltage is lower than a voltage that would result in a change in a polarity of the actuator.

8. In combination with a gasoline engine, the control unit according to claim 6 configured to drive an injection valve for injecting fuel into the gasoline engine.

9. In combination with a diesel engine, the control unit according to claim 6 configured to drive an injection valve for injecting fuel into the diesel engine.

10. The method according to claim 1, wherein the displaceable component to be displaced is an injector needle.

11. A method for operating an injection valve having at least one piezoelectric actuator, a displaceable component, a hydraulic element, and a common housing with said actuator, said component, and said element disposed therein, the method which comprises:

biasing the actuator with a bias voltage having a sign opposite a sign of the drive voltage to thereby contract the actuator and to increase a height of the hydraulic bearing, the bias voltage having a value below a voltage causing a change in a polarity of the actuator; and subsequently applying a drive voltage with a sign opposite the bias voltage to generate a stroke of the displaceable component having a value defined by a voltage-driven expansion of the actuator and the increase in the height of the hydraulic bearing.

\* \* \* \* \*